(12) United States Patent
Liang et al.

(10) Patent No.: US 11,901,220 B2
(45) Date of Patent: Feb. 13, 2024

(54) BILAYER SEAL MATERIAL FOR AIR GAPS IN SEMICONDUCTOR DEVICES

(71) Applicant: Taiwan Semiconductor Manufacturing Co., Ltd., Hsinchu (TW)

(72) Inventors: Shuen-Shin Liang, Hsinchu County (TW); Chen-Han Wang, Zhubei (TW); Keng-Chu Lin, Chao-Chou Ping-Tung (TW); Tetsuji Ueno, Hsinchu (TW); Ting-Ting Chen, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 52 days.

(21) Appl. No.: 16/937,237

(22) Filed: Jul. 23, 2020

(65) Prior Publication Data
US 2021/0193506 A1 Jun. 24, 2021

Related U.S. Application Data

(60) Provisional application No. 62/951,809, filed on Dec. 20, 2019.

(51) Int. Cl.
*H01L 21/768* (2006.01)
*H01L 29/66* (2006.01)

(52) U.S. Cl.
CPC .... *H01L 21/7682* (2013.01); *H01L 21/76826* (2013.01); *H01L 21/76828* (2013.01);
(Continued)

(58) Field of Classification Search
CPC .................. H01L 21/7682; H01L 21/76832
See application file for complete search history.

(56) References Cited

U.S. PATENT DOCUMENTS

| | | | | |
|---|---|---|---|---|
| 8,058,138 B2 * | 11/2011 | McGinnis | ......... | H01L 21/31608 438/422 |
| 8,501,578 B2 * | 8/2013 | Gogoi | .................. | H01L 21/764 438/424 |

(Continued)

FOREIGN PATENT DOCUMENTS

| | | | |
|---|---|---|---|
| CN | 105514025 A | | 4/2016 |
| KR | 20060118257 A | * | 11/2006 |

(Continued)

OTHER PUBLICATIONS

Merriam-Webster definition of "enclosed".*

*Primary Examiner* — Daniel Luke
(74) *Attorney, Agent, or Firm* — Sterne, Kessler, Goldstein & Fox P.L.L.C.

(57) ABSTRACT

The present disclosure relates to a method for forming a semiconductor device includes forming an opening between first and second sidewalls of respective first and second terminals. The first and second sidewalls oppose each other. The method further includes depositing a first dielectric material at a first deposition rate on top portions of the opening and depositing a second dielectric material at a second deposition rate on the first dielectric material and on the first and second sidewalls. The second dielectric material and the first and second sidewalls entrap a pocket of air. The method also includes performing a treatment process on the second dielectric material.

20 Claims, 10 Drawing Sheets

(52) U.S. Cl.
CPC ............... *H01L 21/76831* (2013.01); *H01L 21/76832* (2013.01); *H01L 29/6656* (2013.01); *H01L 29/66795* (2013.01); *H01L 29/6653* (2013.01)

(56) References Cited

U.S. PATENT DOCUMENTS

| | | | |
|---|---|---|---|
| 8,647,992 B2 * | 2/2014 | Liang | ................ H01L 21/02304 |
| | | | 438/763 |
| 9,105,490 B2 | 8/2015 | Wang et al. | |
| 9,236,267 B2 | 1/2016 | De et al. | |
| 9,236,300 B2 | 1/2016 | Liaw | |
| 9,385,037 B2 * | 7/2016 | Lin | ..................... H01L 21/7685 |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 9,892,961 B1 * | 2/2018 | Cheng | ................. H01L 21/0217 |
| 9,929,094 B2 * | 3/2018 | Ting | ................. H01L 21/76849 |
| 10,157,778 B2 * | 12/2018 | Tsai | ..................... H01L 23/5329 |
| 10,505,111 B1 * | 12/2019 | Ok | ......................... H01L 45/144 |
| 10,847,412 B2 * | 11/2020 | Chen | ................... H01L 23/5222 |
| 2014/0084340 A1 | 3/2014 | Wang et al. | |
| 2017/0365462 A1 | 12/2017 | Varadarajan | |
| 2018/0197966 A1 | 7/2018 | Lee et al. | |
| 2019/0198381 A1 | 6/2019 | Park et al. | |
| 2019/0334008 A1 | 10/2019 | Chen et al. | |

FOREIGN PATENT DOCUMENTS

| | | |
|---|---|---|
| TW | 201724353 A | 7/2017 |
| TW | 201822259 A | 6/2018 |

* cited by examiner

BILAYER SEAL MATERIAL FOR AIR GAPS IN SEMICONDUCTOR DEVICES

This application claims the benefit of U.S. Provisional Patent Application No. 62/951,809, titled "Bilayer Sear Material for Air Gaps in Semiconductor Devices," which was filed on Dec. 20, 2019 and is incorporated herein by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. This scaling process provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
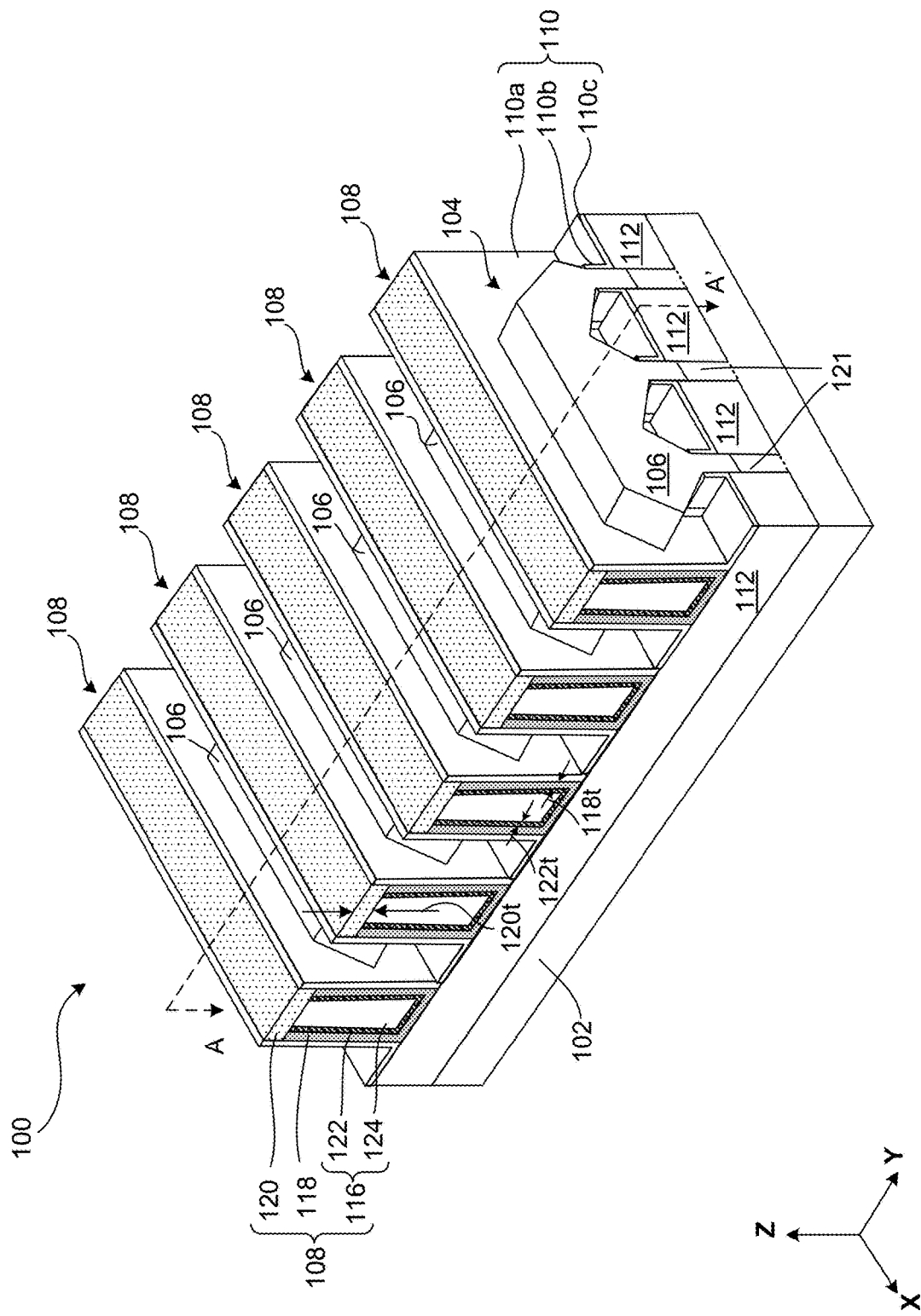
FIG. 1 is an isometric view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of a target value (e.g., ±1%, ±2%, ±3%, ±4%, ±5% of the target value).

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like channel extending from the substrate. FinFETs are compatible with conventional complementary metal-oxide-semiconductor (CMOS) processes and their three-dimensional structure allows them to be aggressively scaled while maintaining gate control and mitigating short channel effects. Gate stacks are used in planar and three-dimensional FETs for controlling the conductivity of the semiconductor device. A gate stack including gate dielectric layer and gate electrode for a finFET device can be formed by a replacement gate process where a polysilicon sacrificial gate structure is replaced by a metal gate structure. Gate dielectric layers, such as a high-k dielectric layer (e.g., a dielectric layer having dielectric constant greater than about 3.9), is formed between the channel and the gate electrode. Spacers can be disposed on sidewalls of the gate stack to protect the gate structures during fabrication processes, such as ion implantation, gate replacement process, epitaxial source/drain structure formation, and other suitable processes. Air gaps can be used in place of spacers to reduce the effective dielectric constant that in turn can reduce parasitic capacitance and improve device performance. Air gaps can be formed by depositing a seal material over an opening between terminals of a semiconductor device such that a pocket of air is trapped between the terminals. As the dielectric constant of air is generally lower than a dielectric material, the effective dielectric constant can be reduced. However, seams in the seal material can lead to defects in the semiconductor device. For example, fabrication processes for forming air gap structures often involve multiple etching and cleaning processes that can etch through portions of the seal material through the seams and cause damage to the air gaps, such as causing the collapse of the seal material or trapping chemical solutions within the air gap. The damaged air gap structure can cause defects in the semiconductor device and lead to low device yield and even device failure.

To address the above shortcomings, the present disclosure provides a semiconductor device and method of fabricating the same to provide simple and cost-effective structures and process for producing seamless seal layers in semiconductor devices. The seamless seal layers can be used to seal an opening and form air gaps between terminals of semiconductor devices. Specifically, a bilayer seal material can be formed by depositing a first seal material, depositing a second seal material, and performing at least one treatment process on the deposited first and second seal materials. The first and second seal materials can be dielectric materials. In some embodiments, the first and second seal materials can be formed using silicon oxycarbide (SiCO). The first seal material is deposited on portions of opposing sidewalls towards the top of an opening and a second seal material is deposited on the first seal material and on exposed surfaces in the opening. The second seal material is deposited on the first seal materials that are on the opposing sidewalls. The deposition process of the second seal material lasts at least until the second seal material from opposing sidewalls are merged to form an enclosed space between the opposing sidewalls. A treatment process can be performed on the deposited first and second seal materials such that seams are removed by the expansion of at least the second seal material. In some embodiments, the treatment process can be an anneal process performed in an oxygen ambient environment. In some embodiments, the first seal material can be deposited at a greater deposition rate than that of the second seal material. In some embodiments, the first and second seal materials can be formed using precursors, such as tetramethyldisiloxane (TMDSO), hydrogen, oxygen, and any other suitable precursors. Forming seal materials by depositing a bilayer seal material, such as silicon oxycarbide, followed by a treatment process on the deposited bilayer seal material can prevent damaging underlying structures, such as the oxidation of metal source/drain structures.

FIG. 1 is an isometric view of exemplary fin field effect transistors (finFETs) structures. FIGS. 2-7 provide various exemplary semiconductor structures and fabrication processes that illustrate the formation of multi-spacer structures having air gaps and seal materials, in accordance with some embodiments. The fabrication processes provided herein are exemplary, and alternative processes in accordance with this disclosure can be performed (though they are not shown in these figures).

FIG. 1 is an isometric view of a finFET, according to some embodiments. FinFET 100 can be included in a microprocessor, memory cell, or other integrated circuit. The view of finFET 100 in FIG. 1 is shown for illustration purposes and may not be drawn to scale. FinFET 100 may include further suitable structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows five gate structures 108. However, based on the disclosure herein, finFET 100 can have more or fewer gate structures. In addition, finFET 100 can be incorporated into an integrated circuit through the use of other structural components—such as S/D contact structures, gate contact structures, conductive vias, conductive lines, dielectric layers, and passivation layers—that are omitted for the sake of clarity.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) portions of fin regions 121 underlying gate structures 108; and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by corresponding one of gate structures 108. Fin regions 121 on opposing sides of gate structures 108 can be etched back such that S/D regions 106 can be epitaxially grown on the etched back portions of fin regions 121.

Fin regions 121 of fin structure 104 can include material similar to substrate 102. S/D regions 106 can include an epitaxially-grown semiconductor material. In some embodiments, the epitaxially-grown semiconductor material is the same material as substrate 102. In some embodiments, the epitaxially-grown semiconductor material includes a different material from substrate 102. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. Other materials for fin structure 104 are within the scope of this disclosure.

In some embodiments, S/D regions 106 can be grown by (i) chemical vapor deposition (CVD), such as by low pressure CVD (LPCVD), ultrahigh vacuum CVD (UHVCVD), reduced pressure CVD (RPCVD), or a suitable CVD process; (ii) molecular beam epitaxy (MBE) processes; (iii) a suitable epitaxial process; and (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be p-type regions or n-type regions. In some embodiments, p-type S/D regions 106 can include SiGe and can be in-situ doped during epitaxial growth using p-type dopants, such as boron, indium, and gallium. For p-type in-situ doping, p-type doping precursors, such as diborane ($B_2H_6$), boron trifluoride ($BF_3$), and other p-type doping precursors, can be used. In some embodiments, n-type S/D regions 106 can include Si and can be in-situ doped during an epitaxial growth process using n-type dopants, such as phosphorus and arsenic. For n-type in-situ doping, n-type doping precursors, such as phosphine ($PH_3$), arsine ($AsH_3$), and other n-type doping precursors, can be used. In some embodiments, S/D regions 106 are not in-situ doped, and an ion implantation process is performed to dope S/D regions 106.

Spacer 110 can include spacer portions 110a that form on sidewalls of gate structure 108 and are in contact with dielectric layer 118, spacer portions 110b that form on sidewalls of fin structure 104, and spacer portions 110c that form as protective layers on STI regions 106. Each spacer portion can also be a multi-spacer structure including more than one spacer structure. For example, spacer portion 110a can include more than one spacer and an air gap formed between gate structure 108 and fin structure 104. A seal material can be formed over the air gap to enclose and protect the air gap from subsequent fabrication processes. The air gap and seal material are not shown in FIG. 1 for simplicity. Spacers 110 can include insulating material, such as silicon oxide, silicon nitride, a low-k material, and a combination thereof. Spacers 110 can have a low-k material with a dielectric constant less than 3.9 (e.g., less than 3.5, 3, and 2.8). As air gaps can have dielectric constant about 1, the effective dielectric constant of spacers 110 can be further reduced compared to spacers formed using low-k material. The low-k material for spacers 110 can be formed using suitable deposition processes, such as an atomic layer deposition (ALD). In some embodiments, spacers 110 can be deposited using CVD, LPCVD, UHVCVD, RPCVD, physical vapor deposition (PVD), any other suitable deposition processes, and combinations thereof. The seal material can be formed by depositing a first seal material on top portions of an opening formed between gate structures 108 and S/D regions 106, followed by a deposition of second seal material on the first seal material to form an enclosure having air trapped in the opening. Other materials and thicknesses for spacers 110 and seal material are within the scope of this disclosure.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having dielectric constant greater than about 3.9). Dielectric layer 118 can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 have a thickness 118t in a range of about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 can be formed by ALD, PVD, CVD, or other suitable deposition processes. Other materials and formation methods for gate metal fill layer 124 are within the scope of this disclosure.

In some embodiments, gate capping layer 120 can have a thickness 120t in a range from about 5 nm to about 50 nm and can protect gate structure 108 during subsequent processing of finFET 100. Gate capping layer 120 can include nitride material, such as silicon nitride, silicon-rich nitride, and silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and other suitable insulating materials. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

Figure 5:
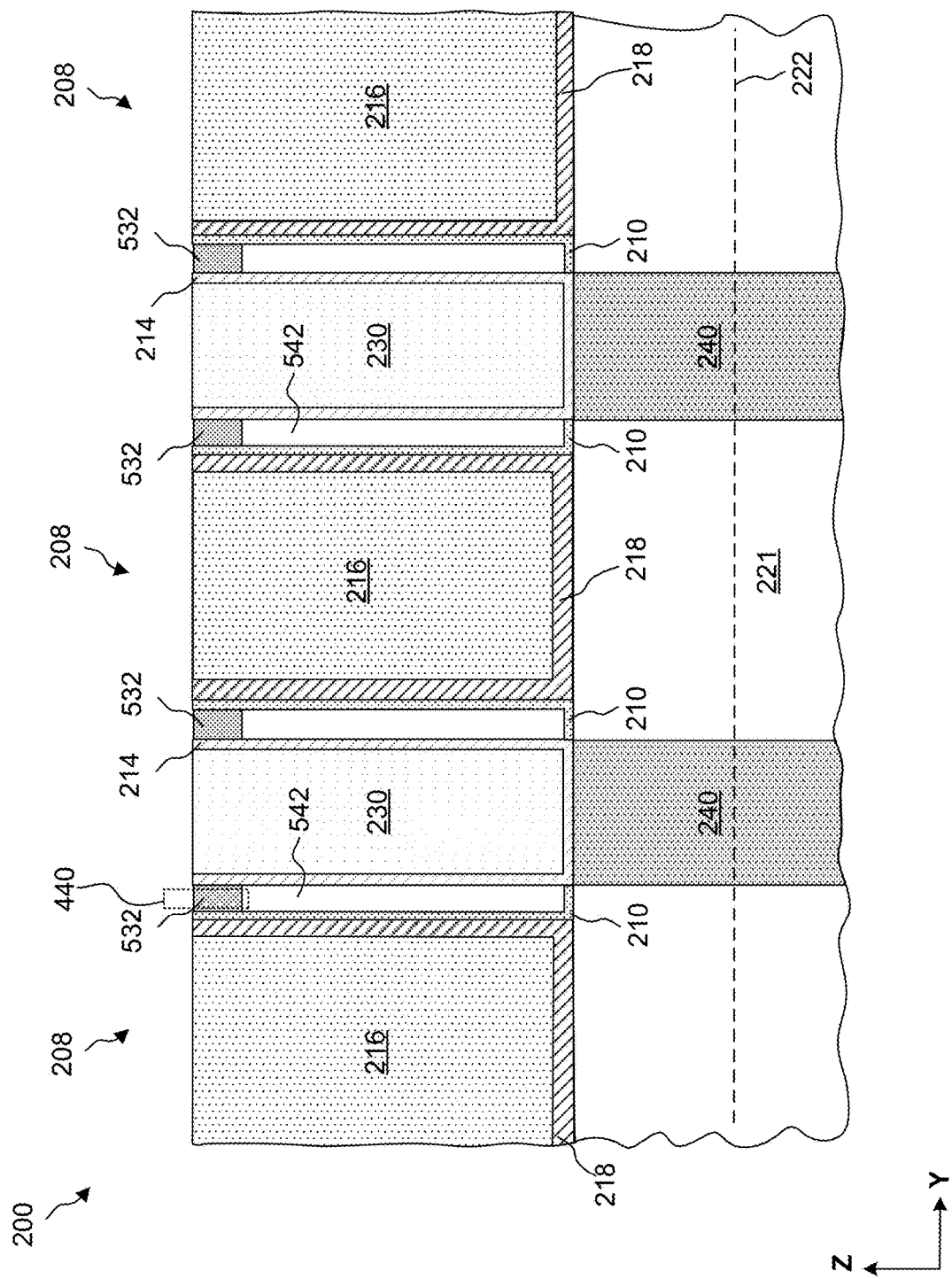
Figure 6:
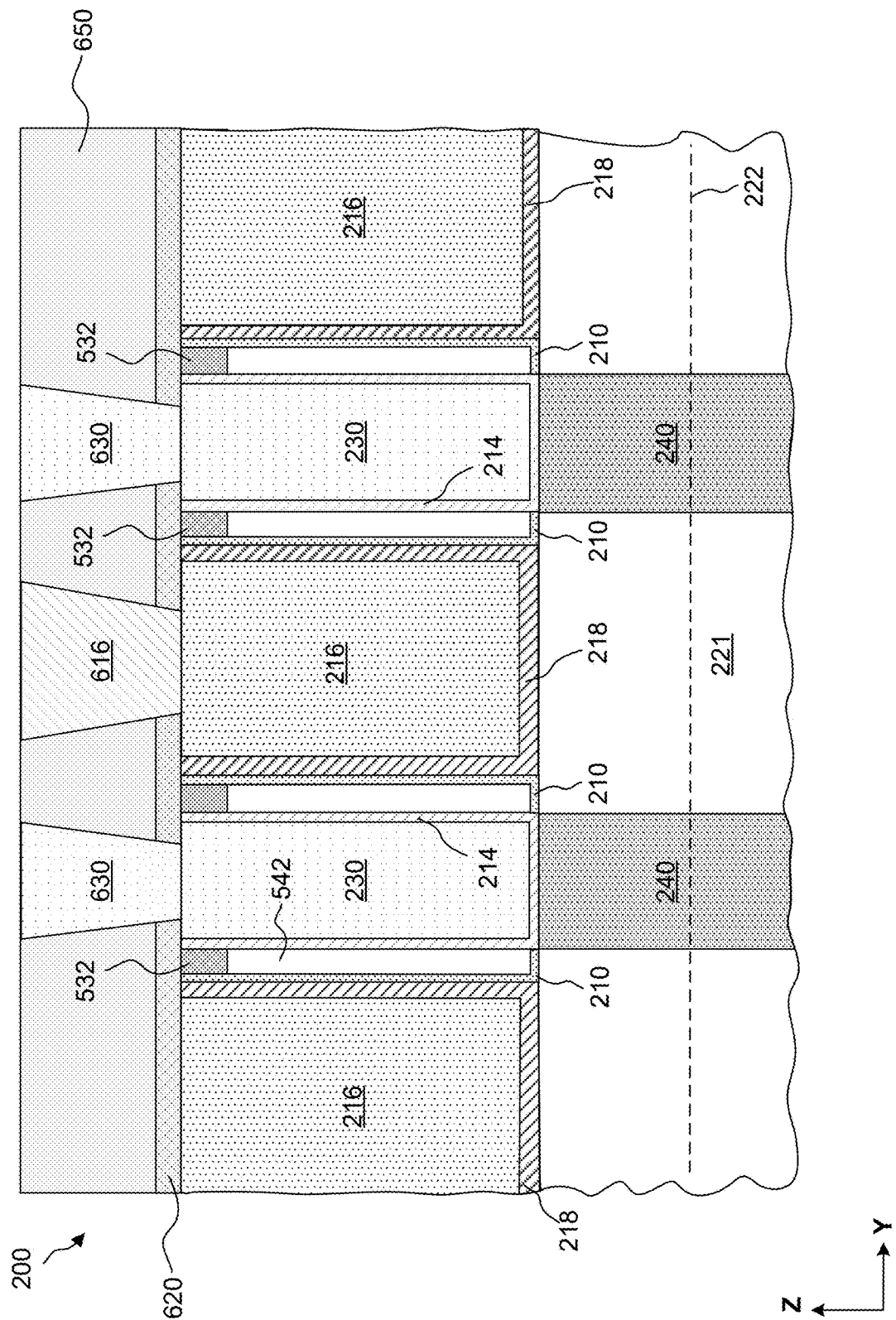
Figure 7:
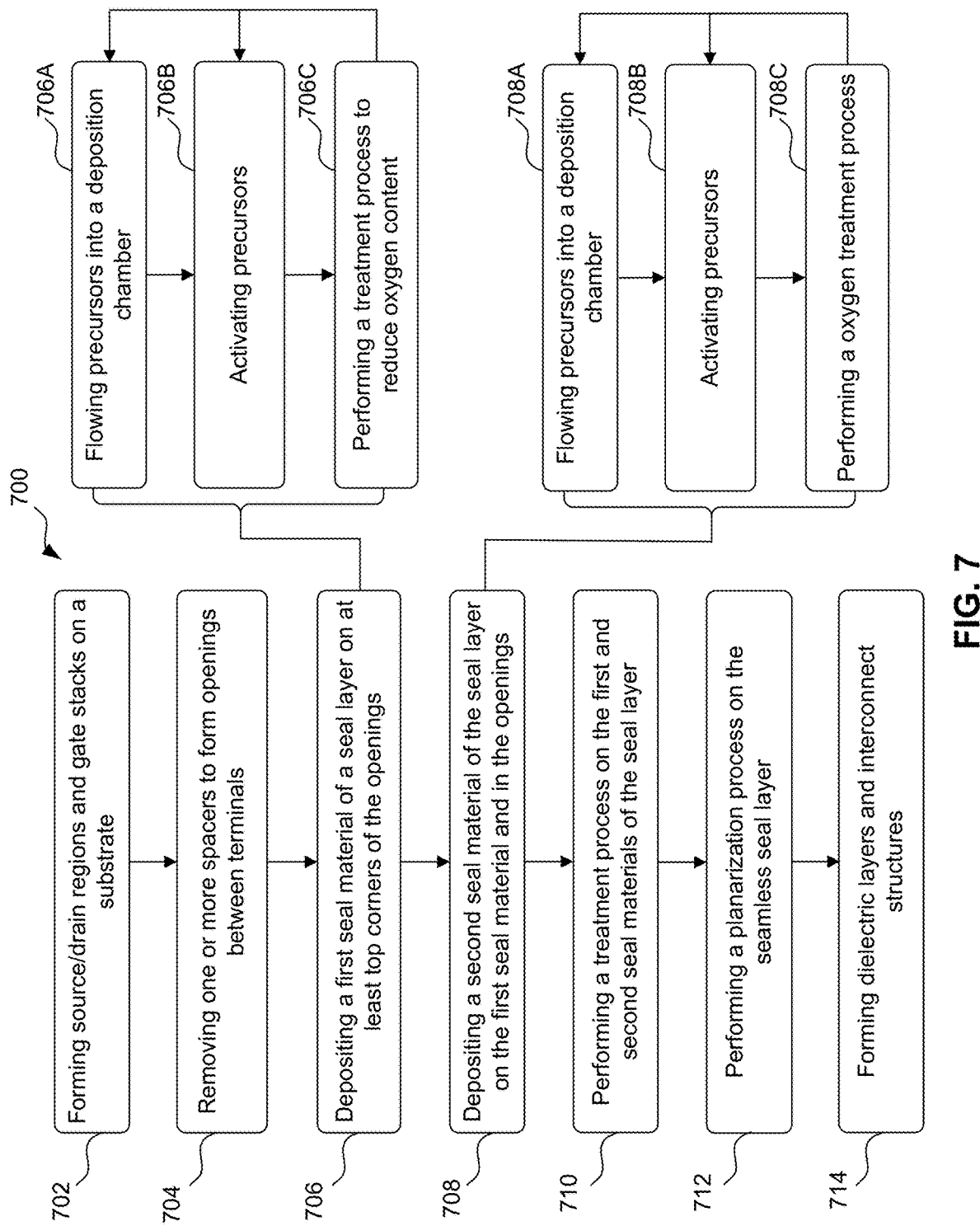
FIG. 7 is a flow diagram of a method of forming bilayer seal structures in semiconductor structures, in accordance with some embodiments.

FIGS. 2-6 provide various exemplary semiconductor structures and fabrication processes that illustrate the formation of spacer structures having air gaps and seamless seal layers, in accordance with some embodiments. FIG. 7 is a flow diagram of a method 700 of forming air gaps and seamless seal layers in semiconductor structures, in accordance with some embodiments of the present disclosure. Based on the disclosure herein, other operations in method 700 can be performed. Further, the operations of method 700 can be performed in a different order and/or vary.

The air gaps with seamless seal layers can provide the benefit of reducing and/or eliminating damage to the air gaps formed between spacer structures. The fabrication processes can be used to form planar semiconductor devices or vertical semiconductor devices, such as finFETs. In some embodiments, the fabrication processes illustrated in FIGS. 2-7 can be used to form semiconductor structures similar to finFET structures described above in FIG. 1. For example, the semiconductor structures illustrated in FIGS. 2-7 can be similar to finFET 100 during different stages of fabrication as viewed from the cut A-A' illustrated in FIG. 1.

Figure 2:
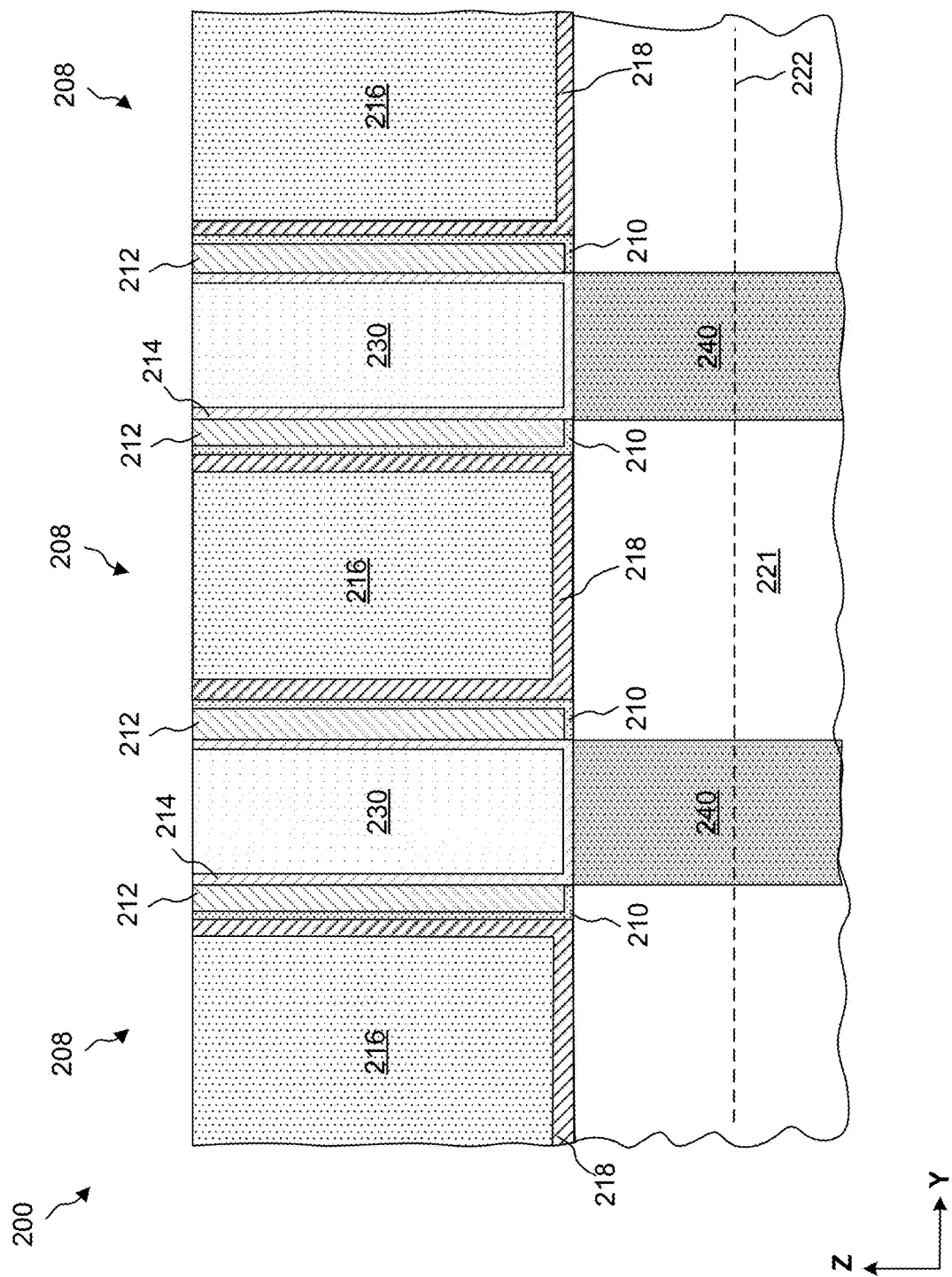
FIGS. 2-6 are cross-sectional views of various partially formed semiconductor structures, in accordance with some embodiments.

Referring to operation 702 of FIG. 7, source/drain regions and gate stacks are formed on a substrate, according to some embodiments. FIG. 2 is a cross-sectional view of a semiconductor structure 200 after three neighboring gate structures 208 and two source/drain contacts 230 are formed over a substrate. The substrate can include fin region 221. Each gate stack such as gate structure 208 includes a gate dielectric layer 218 and a gate electrode 216. Gate dielectric layer 218 can be formed on sidewalls and bottom surfaces of gate electrode 216. Channel regions for semiconductor devices, such as finFETs, can be formed in fin region 221 and under gate structures 208.

Fin region 221 can be current-carrying semiconductor structures formed on the substrate. For example, fin region 221 can be similar to fin region 121 described above in FIG. 1. In some embodiments, fin region 221 can include a semiconductor material, such as germanium, silicon, silicon carbide, gallium arsenide, gallium phosphide, indium phosphide, indium arsenide, indium antimonite, silicon germanium carbide, silicon germanium, gallium arsenic phosphide, gallium indium phosphide, gallium indium arsenide, gallium indium arsenic phosphide, aluminum indium arsenide, aluminum gallium arsenide, any suitable material, and combinations thereof. In some embodiments, fin region 221 can be doped with p-type or n-type dopants.

Gate dielectric layer 218 can be formed on fin region 221 and formed using a high-k dielectric material. Gate dielectric layer 218 can deposited by CVD, ALD, PVD, e-beam evaporation, or other suitable processes. In some embodiments, gate dielectric layer 218 can include a high-k dielectric material, such as $HfO_2$. In some embodiments, gate dielectric layer 218 can include $TiO_2$, $HfZrO$, $Ta_2O_3$, $HfSiO_4$, $ZrO_2$, and $ZrSiO_2$. In some embodiments, gate dielectric layer 218 can be similar to dielectric layer 118 described above in FIG. 1.

Gate electrode 216 can be formed on gate dielectric layer 218 and can include a single metal layer or a stack of metal layers. Gate structures 208 can further include work function layers and are not illustrated in FIG. 2 for simplicity. The stack of metal layers can include metals having work functions similar to or different from each other. In some embodiments, gate electrode 216 can be formed of a conductive material, such as Al, Cu, W, Ti, Ta, TiN, TaN, NiSi, CoSi, Ag, TaC, TaSiN, TaCN, TiAl, TiAlN, WN, metal alloys, and combinations thereof. Gate electrode 216 can be formed using a suitable deposition process, such as ALD, CVD, PVD, plating, and combinations thereof. Other materials and formation methods for gate electrode 216 are within the scope of this disclosure. In some embodiments, gate electrode 216 can be formed using a gate replacement process, where a polysilicon gate is removed and a metal gate electrode is formed in the place of the removed polysilicon gate.

Spacer structures can be formed on sidewalls of gate structures 208. In some embodiments, gate structures can include a gate electrode, dielectric layers, spacers, any other suitable structures, and are collectively referred to as gate structures for ease of reference. In some embodiments, spacers 210 and 212 can be formed on sidewalls of gate dielectric layer 218 and on top surfaces of fin region 221. Spacer structures are formed on to protect gate structure 208 during subsequent processing. In some embodiments, spacer 210 can have an L-shaped cross section with a vertical portion formed on the sidewall of gate dielectric layer 218 and a horizontal portion formed on the top surface of fin region 221. Spacer 210 can be formed using a dielectric material, such as silicon carbide nitride, silicon nitride, silicon oxide, any suitable dielectric material, and combinations thereof. In some embodiments, the carbon atomic content can be less than about 30% for spacer 210 formed using silicon carbide nitride. In some embodiments, the carbon atomic content of spacer 210 can be between about 20% and about 30%. Additional spacers, such as spacer 212, can also be formed. For example, spacer 212 can be formed on the horizontal portion of spacer 210, on the top surface of fin region 221, or both. In some embodiments, spacer 212 can be formed using a dielectric material, such as silicon. In some embodiments, the materials that form spacers 210 and 212 can have high etch selectivity (e.g., greater than about 10) such that when spacer 212 is removed spacer 210 can remain substantially intact. In some embodiments, spacers 210 and 212 can be formed using any suitable dielectric material, such as silicon nitride, silicon oxynitride, silicon carbide, silicon oxycarbide, silicon on glass (SOG), tetraethoxysilane (TEOS), PE-oxide, HARP formed oxide, and combinations thereof. In some embodiments, spacers 210 and 212 can be formed using a low-k dielectric material.

Source/drain (S/D) regions 240 can be formed in fin region 221. S/D regions 240 can be p-type regions or n-type regions. In some embodiments, p-type S/D regions 240 can include SiGe and can be in-situ doped during an epitaxial growth process using p-type dopants, such as boron, indium, and gallium. For p-type in-situ doping, p-type doping precursors, such as $B_2H_6$, $BF_3$, and other p-type doping precursors, can be used. In some embodiments, n-type S/D regions 240 can include Si and can be in-situ doped during an epitaxial growth process using n-type dopants, such as phosphorus and arsenic. For n-type in-situ doping, n-type doping precursors, such as $PH_3$, $AsH_3$, and other n-type doping precursors, can be used. In some embodiments, S/D regions 240 are not in-situ doped, and an ion implantation process is performed to dope S/D regions 240. In some embodiments, S/D regions can be similar to S/D regions 160 described above in FIG. 1.

Source/drain (S/D) contacts 230 can be in physical and electrical contact with source/drain regions 240. S/D contacts 230 can be formed by depositing a conductive material between adjacent gate structures 208. For example, openings can be formed between spacers 212 to expose underlying S/D regions 240. A deposition process can be performed to deposit the conductive material in the openings such that electrical connections can be made. In some embodiments, a contact etch stop layer (CESL) 214 can be deposited in the opening prior to the deposition of the conductive materials. Examples of the conductive material deposition process can include PVD, sputtering, electroplating, electroless plating, any suitable deposition process, and combinations thereof. A planarization process can be performed after the deposition process such that top surfaces of gate electrode 216, spacers 210 and 212, CESL 214, and source/drain contacts 230 can be substantially coplanar (e.g., an even surface). In some embodiments, S/D contacts 230 can be formed using tungsten, aluminum, cobalt, silver, any suitable conductive material, and combinations thereof.

Similar to the finFET 100 described in FIG. 1, semiconductor structure 200 can be formed on a substrate where fin regions 221 protrude from STI regions. The STI regions are not visible from the cross-sectional view of semiconductor structure 200 illustrated in FIG. 2, but a top surface of the STI regions is represented by dashed line 222 for ease of description.

Figure 3:
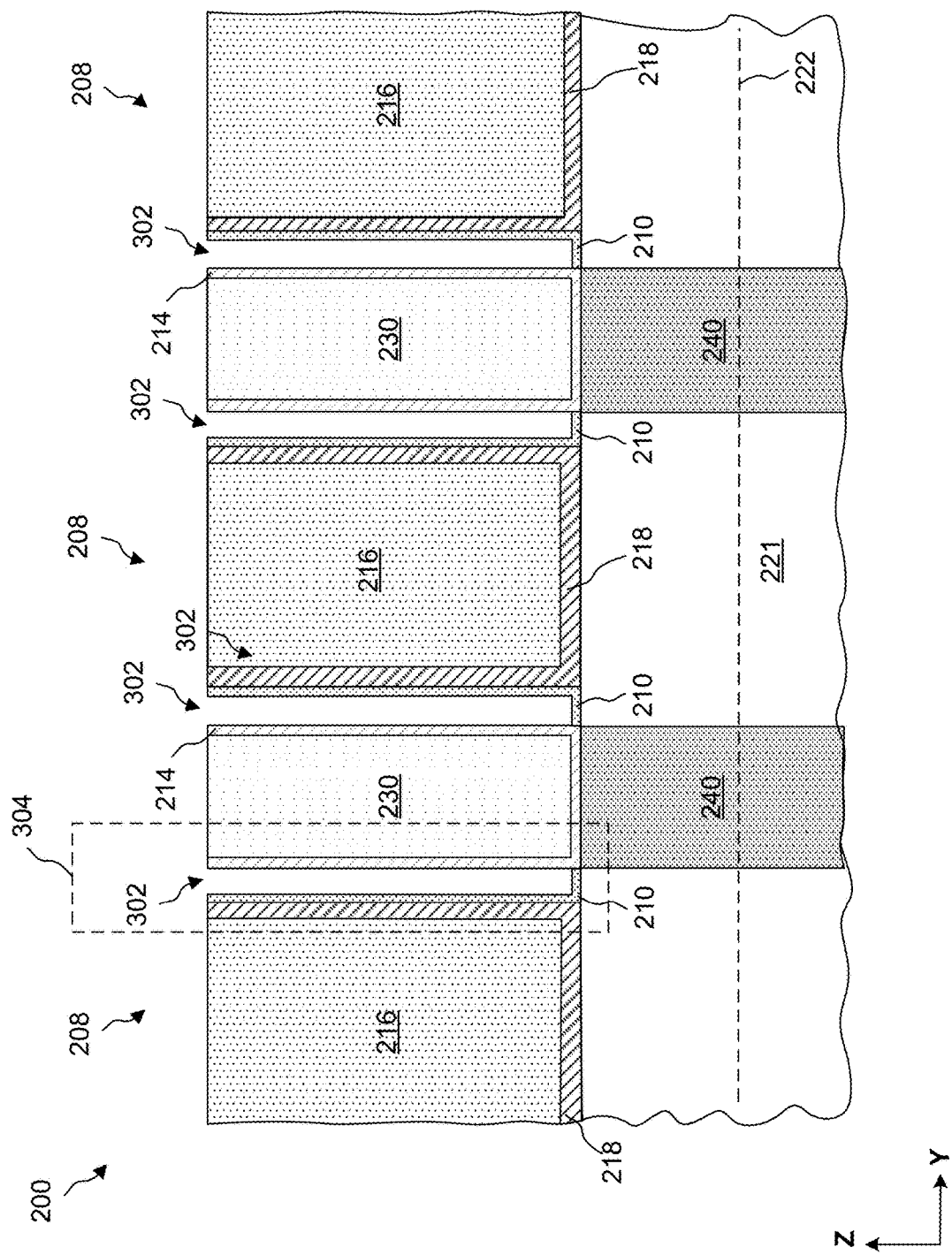

Referring to operation 704 of FIG. 7, one or more spacers are removed to form openings between terminals of the semiconductor device, according to some embodiments. FIG. 3 is a cross-sectional view of the semiconductor device after one or more spacers are removed to form openings. One or more spacers of the spacers between gate electrode 216 and S/D contacts 230 can be removed. For example, spacers 212 can be removed to form openings 302 that is surrounded by spacer 210 and CESL 214. One or more etching processes can be used to remove spacer 212. In some embodiments, an etching process that has high etch selectivity of spacer 212 over other structures in semiconductor structure 200 can be used to remove spacer 212 while keeping the other exposed structures intact. For example, spacers 212 can be formed using silicon carbide nitride, and a wet etching process and/or a plasma etching can be used to selectively remove spacers 212. For example, spacers 212 can be formed using silicon material and a capacitively coupled plasma (CCP) etching process using nitrogen tetrafluoride and hydrogen as precursors and be used to selectively remove spacers 212. In some embodiments, the plasma etching process can be performed at a temperature between about 0° C. and about 100° C. For example, the processing temperature can be between about 0° C. and about 30° C., between about 30° C. and about 60° C., between about 60° C. and about 100° C., or any suitable temperature range. In some embodiments, the plasma etching process can be performed at a chamber pressure between about 500 mTorr and about 5 Torr. For example, the chamber pressure can be between about 500 mTorr and about 2 Torr, between about 2 Torr and about 5 Torr, or any suitable pressure.

Figure 4A:
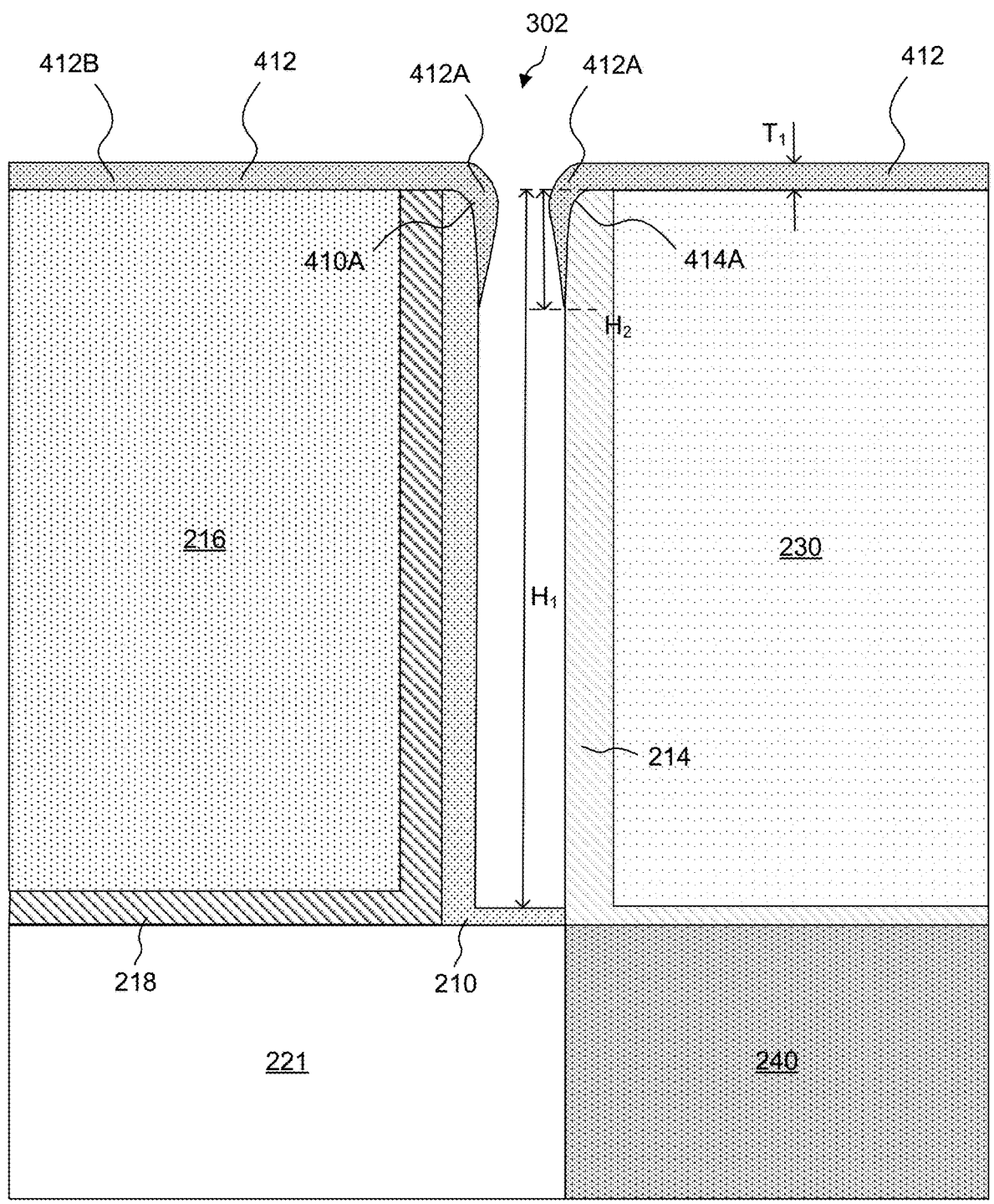
Figure 4B:
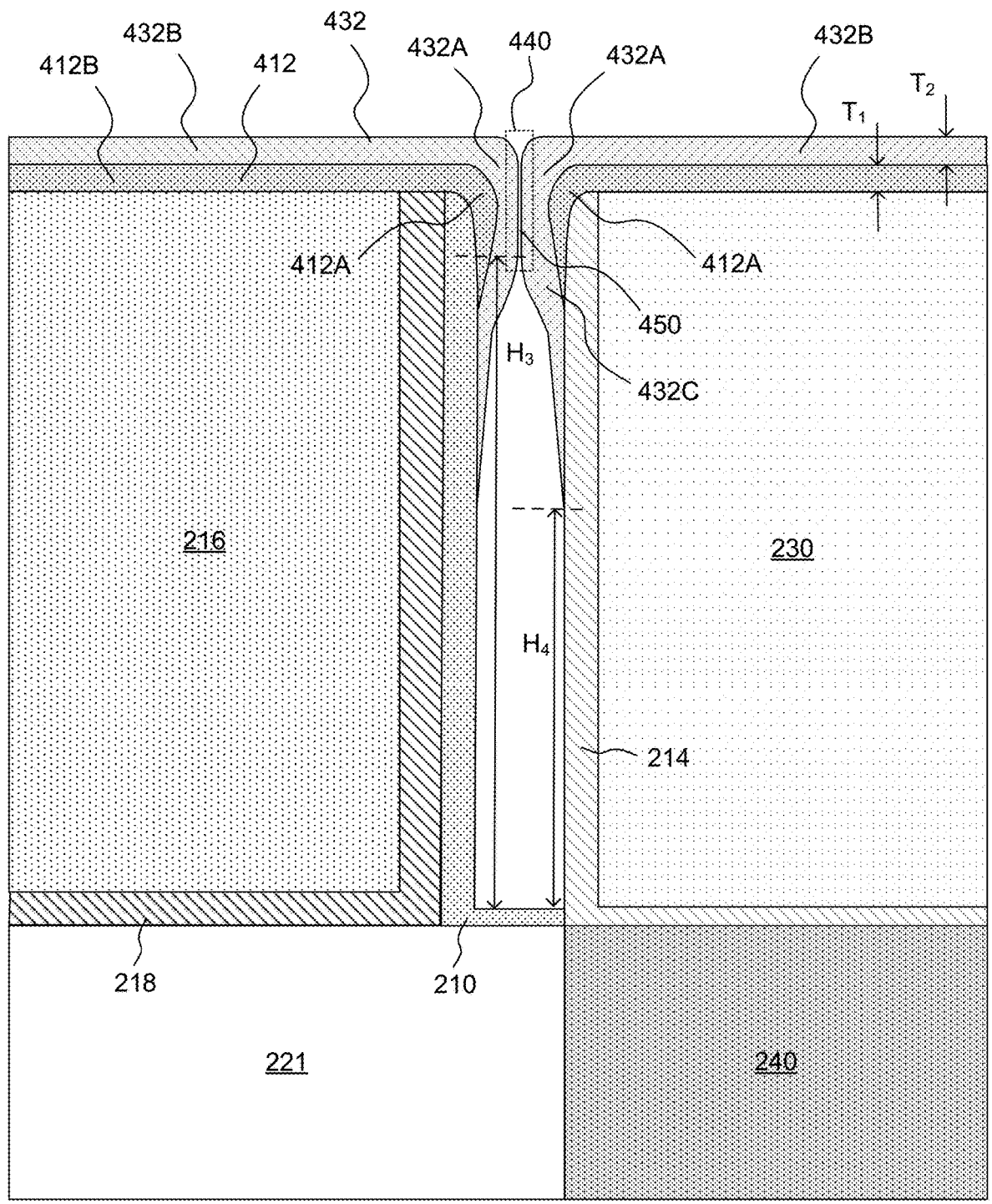
Figure 4C:
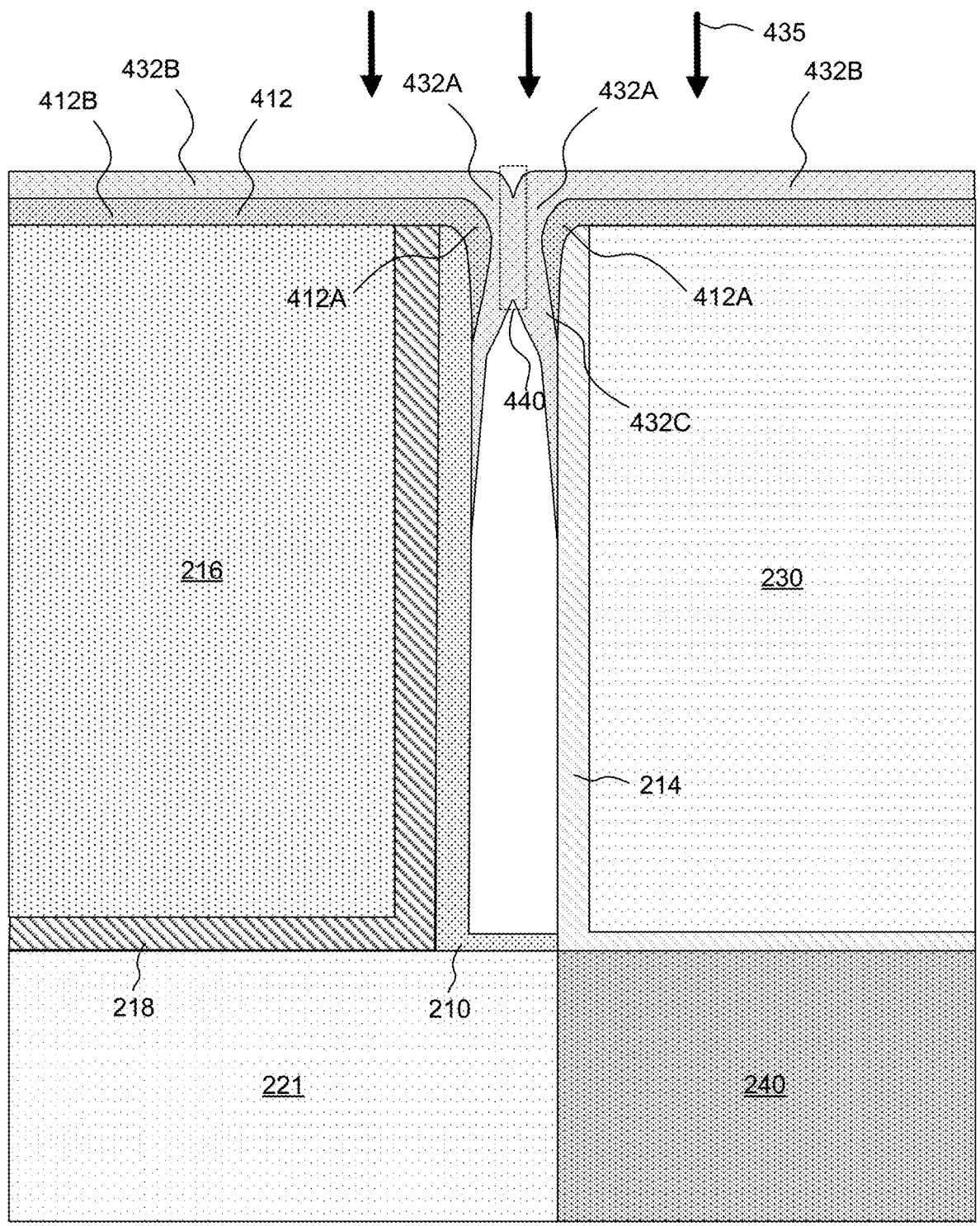

FIGS. 4A-4C are cross-sectional views illustrating seamless seal material formed in the openings of the semiconductor device, according to some embodiments. FIGS. 4A-4C are enlarged views of region 304 of FIG. 3. Other structures can be included in the structures shown in FIGS. 4A-4C and are not illustrated for simplicity.

Referring to operation 706 of FIG. 7, a first seal material is deposited on at least corners of openings in the semiconductor device, according to some embodiments. FIG. 4A is a cross-sectional view illustrating the semiconductor device after the first seal material is deposited. First seal material 412 is deposited on top surfaces of gate electrode 216, gate dielectric layer 218, S/D contacts 230, and CESL 214. In some embodiments, first seal material 412 can also be deposited in opening 302. For example, first seal material 412 can be deposited on sidewalls of spacer 210 and CESL 214. In some embodiments, first seal material 412 can be deposited on the bottom of opening 302, such as on the top surface of the horizontal portion of spacer 210 formed on fin region 221. In some embodiments, first seal material 412 can also be formed on fin region 221 if a portion of the top surface of fin region 221 is exposed between spacer 210 and CESL 214. First seal material 412 can include a corner portion 412A formed on spacer 210 and CESL 214. Top surfaces of spacer 210 and CESL 214 can respectively have rounded corners 410A and 414A to facilitate the growth of corner portion 412A of first seal material 412. The curved surfaces of rounded corners 410A and 414A can reduce the formation of voids or discontinuations in first seal material 412 compared to corners having right angles or sharp edges. Corner portions 412A of first seal material 412 can contour the curved surfaces of rounded corners 410A and 414A. First seal material can have horizontal portions 412B formed on the top surfaces of gate electrode 216, gate dielectric layer 218, and S/D contacts 230 to protect them from subsequent fabrication processes. For example, horizontal portions 412B can prevent oxidation of underlying materials during subsequent etching or treatment processes. A thickness $T_1$ of horizontal portions 412B can be between about 10 nm and about 40 nm. In some embodiments, thickness $T_1$ can be between about 10 nm and about 15 nm, between about 15 nm and about 30 nm, between about 30 nm and about 40 nm, or any suitable thicknesses. Increasing thickness $T_1$ can provide the benefits of providing greater protection for underlying structures (e.g., metal contacts or gate structures) from subsequent processing, such as etching or cleaning processes. In addition, thickness $T_1$ can be adjusted to provide a nominal opening profile of opposing corner portions 412A. For example, increasing thickness $T_1$ can reduce the distance between opposing corner portions 412A, which in turn can form an air gap with a greater volume by reducing the amount of the second seal material deposited below corner portions 412A.

First seal material 412 can affect the volume of subsequently formed air gaps between gate electrode 216 and S/D contacts 230 by adjusting the depth of first seal material 412 that extends into opening 302. Specifically, corner portions 412A of first seal material 412 can extend into opening 302 by forming on sidewalls of spacers 210 and CESL 214. Openings 302 can have depth $H_1$, and a greater extension depth $H_2$ of corner portions 412A into opening 302 can provide a smaller subsequently formed air gap (not shown in FIG. 4A) in opening 302. For example, a greater value of the ratio $H_2$ over $H_1$ can leave less volume in opening 302 for air gaps to be formed. In some embodiments, opening 302 has a height $H_1$ that can be between about 30 nm and about 60 nm. In some embodiments, extension depth $H_2$ can be between about 10 nm and about 20 nm. In some embodiments, the ratio of $H_1$ over $H_2$ can be between about 11 and about 2. In some embodiments, a planarization process such as a chemical mechanical polishing process (CMP) can be performed on the first seal material 412, and heights $H_1$ and $H_2$ may be reduced. For example, after the planarization process, height $H_1$ can be between about 25 nm and about 55 nm, and height $H_2$ can be between about 5 nm and about 15 nm.

First seal material 412 can be formed using any suitable dielectric material. In some embodiments, first seal material 412 can be formed using material that provides sufficient mechanical strength to support the air gap structure and chemical resistance to protect from subsequent chemical processes. In some embodiments, first seal material 412 can include silicon-oxygen or silicon-carbon cross-links. For example, first seal material 412 can be formed using a silicon oxycarbide material. The oxygen and carbon atomic contents of the silicon oxycarbide material can be adjusted to achieve various properties of first seal material 412. For example, increasing the oxygen atomic content of first seal material 412 can reduce current leakage in first seal material 412. Increasing the carbon atomic content in first seal material 412 can provide increased etch selectivity of first seal material 412 over adjacent structures, such as spacers 210 and 214. In some embodiments, the silicon atomic content of first seal material 412 formed using silicon oxycarbide can be between about 28% and about 35%. For example, the silicon atomic content can be between about 28% and about 31%, between about 31% and about 35%, or any suitable range. In some embodiments, the oxygen atomic content of first seal material 412 can be between about 35% and about 52%. For example, the oxygen atomic content can be between about 35% and about 45%, between about 45% and about 52%, or any suitable range. In some embodiments, the carbon atomic content of first seal material 412 can be between about 15% and about 35%. For example, the carbon atomic content can be between about 15% and about 25%, between about 25% and about 35%, or any suitable ranges. In some embodiments, first seal material 412 can be deposited using radical CVD, CVD, ALD, LPCVD, UHVCVD, RPCVD, PVD, any other suitable deposition processes, and combinations thereof. In some embodiments, first seal material 412 can be deposited using a radical CVD process with an ion filter.

Figure 8:
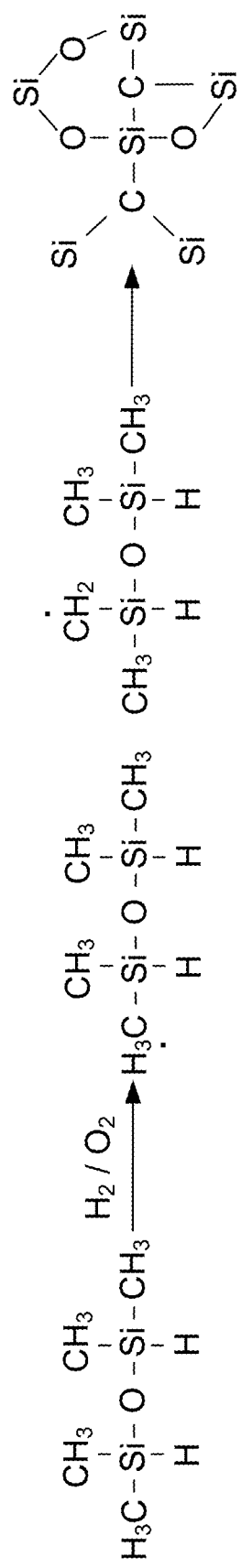
FIG. 8 illustrates chemical reactions occurring during the formation of bilayer seal structures in semiconductor structures, in accordance with some embodiments.

Referring to FIG. 7, the deposition of first seal material 412 can include one or more operations. For example, the deposition can include a first operation 706A of flowing precursors into a deposition chamber. The precursors can provide one or more of the following bonding types: silicon-oxygen, silicon-hydrogen, and silicon-carbon. In some embodiments, the precursors are in gas phase and can include, for example, tetramethyldisiloxane (TMDSO) hydrogen gas, and oxygen gas. Other suitable precursors can also be included. The flow ratio of hydrogen gas over oxygen gas can be greater than about 20 to minimize the oxidation of underlying materials while facilitating the chemical reactions needed for the deposition. For example, the flow ratio of hydrogen gas over oxygen gas can be between about 20 and about 30. The deposition can further include a second operation 706B that includes activating plasma and used to activate the precursors in their gas phase to form silicon-oxygen and silicon-carbon cross-links. The deposition process can include a third operation 706C of a treatment process to reduce the oxygen content from the deposited seal material. The treatment process can be performed in a hydrogen chamber environment. In some embodiments, the treatment process can be performed in chamber environments having any suitable type of gas, such as argon, nitrogen, and any suitable gas. In some embodiments, the deposition process can be performed at a temperature between about 300° C. and about 700° C. For example, the deposition temperature can be between about 300° C. and about 500° C., between about 500° C. and about 700° C., and at any suitable temperature. In some embodiments, the deposition and treatment process can be performed in cycles, such as a cyclic process deposition-treatment process. For example, the deposition and treatment process can be followed by another deposition and treatment process until a nominal thickness or quality of first seal material has been achieved. In some embodiments, the cyclic process can include flowing precursors into the deposition chamber and performing a series of activation/treatment processes. In some embodiments, the cyclic process can include performing in series the following: flowing precursors, activating the precursors, and performing the treatment. In some embodiments, the flowing of precursors can be performed between a series of activation/treatment processes. FIG. 8 illustrates exemplary chemical reactions occurring during the deposition of first seal material 412.

The deposition rate can be adjusted through various deposition parameters. A greater deposition speed can facilitate greater accumulation of first seal material at curved surfaces 410A and 414A. A lower deposition speed can provide a greater extension depth $H_2$ of first seal material 412 into opening 302. A greater deposition speed can be achieved through adjusting various suitable processing parameters. In some embodiments, the deposition process can be performed at a deposition rate greater than about 25 Å/min. For example, the deposition process can be performed at a rate between about 25 Å/min and about 35 Å/min. In some embodiments, the deposition rate can be between about 55 Å/min and about 65 Å/min. For example, the deposition rate can be about 60 Å/min. In some embodiments, a lower chamber pressure during deposition or greater plasma power can provide a greater deposition rate. In some embodiments, chamber pressure can be between about 0.5 Torr and about 12 Torr. For example, chamber pressure can be between 0.5 Torr and about 3 Torr, between about 3 Torr and about 7 Torr, between about 7 Torr and about 12 Torr, and any other suitable ranges/values. As another example, a chamber pressure between about 4.5 Torr and about 5.5 Torr can provide deposition rate of about 35 Å/min while a chamber pressure between about 6 Torr and about 7 Torr can provide a lower deposition rate at about 20 Å/min.

The plasma power level for the deposition can also affect the deposition rate. A greater plasma power level can provide a greater deposition rate. In some embodiments, the plasma power level can be between about 500 W and about 3000 W. For example, the plasma power level can be between about 500 W and about 1000 W, between about 1000 W and about 2000 W, between about 2000 W and about 3000 W, and at any other suitable power levels.

The density of first seal material 412 can also be adjusted through deposition parameters. Increasing the density of seal material 412 can provide for greater mechanical support and improved chemical resistance. In some embodiments, first seal material 412 can have a density greater than about 2.0 g/cm$^3$. For example, the density of first seal material 412 can be between about 2 g/cm$^3$ and about 2.2 g/cm$^3$. In some embodiments, the density can be between about 2.2 g/cm$^3$ and about 3.2 g/cm$^3$. In some embodiments, a greater density can be achieved through lower chamber processing pressure and greater plasma power level. In some embodiments, the chamber processing pressure can be between about 0.5 Torr and about 12 Torr. For example, the chamber processing pressure can be between about 0.5 Torr and about 3 Torr, between about 3 Torr and about 8 Torr, between about 8 Torr and about 12 Torr, and any other suitable ranges or values. In some embodiments, the plasma power level can be between about 500 W and about 3000 W. For example, the plasma power level can be between about 500 W and about 2000 W, between about 2000 W and about 3000 W, and any other suitable ranges or values. In some embodiments, the deposition process can use radical triggered chemical reaction with an ion filter. Using an ion filter in a plasma deposition process can improve the conformity of the deposited first seal material 412.

The dielectric constant of first seal material 412 can be less than about 5. In some embodiments, first seal material 412 can have a dielectric constant between about 3.2 and about 5. A lower dielectric constant of first seal material 412 can lead to lower parasitic capacitance of the terminals of semiconductor device 200. In some embodiments, the leakage current in semiconductor structure 200 can be less than about $1E^{-8}$ Å/cm$^2$ at 2 MV/cm.

An optional treatment process can be performed on first seal material 412 to further increase the amount of its internal crosslinks and/or improve its density. For example, a hydrogen anneal process can be performed to reduce the oxygen content and can form additional Si—C—Si bonds in first seal material 412. The hydrogen treatment process can also remove chemical byproducts, such as $H_2O$. In some embodiments, the optional treatment process can be performed for less than about 1 min and greater than about 5 s. For example, the treatment process can be performed for between about 40 s and about 1 min. In some embodiments, the optional treatment process can be performed at a chamber pressure lower than about 5 Torr. For example, the chamber pressure can be set at about 3 Torr. In some embodiments, the optional treatment process can be performed at an elevated temperature. For example, the processing temperature can be set at greater than about 300° C. In some embodiments, the processing temperature can be about 350° C. In some embodiments, increasing the treatment time, reducing chamber pressure, and/or increasing processing temperature can increase the density and result in more cross links of first seal material 412.

Referring to operation 708 of FIG. 7, a second seal material is deposited on the first seal material and in the openings, according to some embodiments. FIG. 4B is a cross-sectional view illustrating the semiconductor device after the second seal material is deposited. Second seal material 432 is deposited on portions of surfaces of first seal material 412, spacer 210, and CESL 214. Second seal material 432 can include at least: (i) corner portions 432A deposited on corner portions 412A of first seal material 412; (ii) horizontal portion 432B deposited on 412B of first seal material 412, and (iii) vertical portions 432C deposited on sidewalls of spacer 210 and CESL 214. In some embodiments, second seal material 432 can be deposited on the bottom of opening 302, such as on the top surface of the horizontal portion of spacer 210 formed on fin region 221.

Second seal material 432 can be deposited using any suitable deposition process. For example, second seal material 432 can be deposited using a CVD process. Semiconductor structure 200 can be loaded into a deposition chamber and a seal material is subsequently blanket deposited. As precursors in the deposition chamber have to move through the opening formed between opposing corner portions 412A of first seal material 412 to be deposited on exposed surfaces of opening 302, the precursors have lower probabilities to come into contact with surfaces of spacers 210 and CESL 214 compared to the top surfaces of horizontal portions 412B. Accordingly, the seal material is deposited at a much lower rate in opening 302 that is below corner portions 412A. As the seal material gradually accumulates on opposing corner portions 412A of first seal material 412 to form corner portions 432A of second seal material 432, corner portion 432A being deposited over one corner portion 412A would merge at region 440 with another corner portion 432A deposited over an opposing corner portion 412A. At region 440, a seam 450 is formed between the adjacent corner portions 432A of second seal material 432. A thickness $T_2$ of horizontal portions 432B can be between about 20 nm and about 50 nm. In some embodiments, thickness $T_2$ can be between about 20 nm and about 30 nm, between about 30 nm and about 40 nm, between about 40 nm and about 50 nm, or any suitable thicknesses. In some embodiments, a total of thicknesses $T_1$ and $T_2$ can be between about 40 nm and about 80 nm. In some embodiments, the total of thicknesses $T_1$ and $T_2$ can be greater than 80 nm. The deposition of second seal material 432 can proceed until the opening between corner portions 412A of first seal material 412 has been closed. Increasing thickness $T_2$ can provide the benefits of ensuring the opening between corner portions 412A has been closed by the deposition of second seal material 432 and an air gap has been formed.

Second seal material 432 can affect the volume of subsequently formed air gaps between gate electrode 216 and S/D contacts 230 by adjusting the depth of second seal material 432 that extends into opening 302. Specifically, vertical portions 432C of second seal material 432 can extend into opening 302 by forming on sidewalls of spacers 210 and CESL 214. A distance $H_3$ between seam 450 and the bottom surface of opening 302 can be between about 20 nm and about 50 nm. A greater depth $H_3$ can provide a greater air gap 442 formed between gate electrode 216 and S/D contacts 230. A distance $H_4$ between the lower end of vertical portion 432C and the bottom surface of opening 302 can be between about 0 and about 45 nm.

Second seal material 432 can be formed using any suitable dielectric material. In some embodiments, second seal material 432 can be formed using material that provides sufficient bonding strength to first seal material 412. In some embodiments, second seal material 432 can include silicon-oxygen or silicon-carbon cross-links. For example, second seal material 432 can be formed using a silicon oxycarbide material. In some embodiments, the silicon, oxygen, and carbon atomic contents of second seal material 432 after its deposition process can be similar to those of first seal material 412. In some embodiments, those atomic contents can be different between first and second seal materials 412 and 432. In some embodiments, second seal material 432 can be deposited using radical CVD, CVD, ALD, LPCVD, UHVCVD, RPCVD, PVD, any other suitable deposition processes, and combinations thereof. In some embodiments, second seal material 432 can be deposited using a radical CVD process with an ion filter. In some embodiments, the deposition of second seal material 432 can be similar to the deposition process of first seal material 412. For example, the deposition process of second seal material 432 can include a first operation 708A by flowing precursors into a deposition chamber. In some embodiments, second seal material 432 can be formed by a CVD process using precursors that include, for example, tetramethyldisiloxane (TMDSO) hydrogen gas, and oxygen gas. Other suitable precursors can also be used. The flow ratio of hydrogen gas over oxygen gas can be greater than about 20 to minimize the oxidation of underlying materials while facilitating the chemical reactions needed for the deposition. For example, the flow ratio of hydrogen gas over oxygen gas can be between about 20 and about 30. The deposition can further include a second operation 708B that includes activating plasma and used to activate the precursors in their gas phase to form silicon-oxygen and silicon-carbon cross-links. In some embodiments, the deposition process can be performed at a temperature between about 300° C. and about 700° C. For example, the deposition temperature can be between about 300° C. and about 450° C., between about 450° C. and about 700° C., and at any other suitable temperatures. The deposition process can further include a third operation 708C where a treatment process is performed on second seal material 432. In some embodiments, the treatment process can be an anneal process performed in an oxygen environment. In some embodiments, the treatment process can be similar to the treatment process described below with reference to operation 710. In some embodiments, the treatment processes can be different. In some embodiments, third operation 708C can include an anneal process performed in a deposition chamber filled with non-reactant gases, such as argon. In some embodiments, third operation 708C can be a treatment process performed using hydrogen. In some embodiments, the cyclic process can include flowing precursors into the deposition chamber and performing a series of activation/treatment processes. In some embodiments, the cyclic process can include performing in series the following: flowing precursors, activating the precursors, and performing the treatment. In some embodiments, the flowing of precursors can be performed between a series of activation/treatment processes. FIG. 8 illustrates exemplary chemical reactions occurring during the deposition of second seal material 432.

The deposition rate can be adjusted through various deposition parameters. Second seal material 432 can be deposited at a lower deposition rate than first seal material 412. In some embodiments, second seal material 432 can be a substantially conformal film deposition over corner portions 412A and horizontal portion 412B of first seal material 412. A greater deposition speed can facilitate greater accumulation of second seal material at corner portions 412A. A lower deposition speed can provide a greater extension of second seal material 432 into opening 302. A greater deposition speed can be achieved through adjusting various suitable processing parameters. In some embodiments, the deposition process can be performed at a deposition rate less than about 30 Å/min. For example, the deposition process can be performed at a rate between about 20 Å/min and about 30 Å/min. In some embodiments, a lower chamber pressure during deposition or greater plasma power can provide a greater deposition rate. In some embodiments, the chamber pressure can be between about 0.5 Torr and about 12 Torr. For example, chamber pressure can be between 0.5 Torr and about 3 Torr, between about 3 Torr and about 7 Torr, between about 7 Torr and about 12 Torr, and any other suitable ranges/values.

The plasma power level for the deposition can also affect the deposition rate. A greater plasma power level can provide a greater deposition rate. In some embodiments, the plasma power level can be between about 500 W and about 3000 W. For example, the plasma power level can be between about 500 W and about 1000 W, between about 1000 W and about 2000 W, between about 2000 W and about 3000 W, and at any other suitable power levels.

The density of second seal material 432 can also be adjusted through deposition parameters. Increasing the density of second seal material 432 can provide for greater mechanical support and improved chemical resistance. In some embodiments, second seal material 432 can have a density greater than about 2.0 g/cm$^3$. For example, the density of second seal material 432 can be between about 2 g/cm$^3$ and about 2.5 g/cm$^3$. In some embodiments, the density can be between about 2.2 g/cm$^3$ and about 2.5 g/cm$^3$. In some embodiments, a greater density can be achieved through lower chamber processing pressure and greater plasma power level. In some embodiments, the chamber processing pressure can be between about 0.5 Torr and about 12 Torr. For example, the chamber processing pressure can be between about 0.5 Torr and about 3 Torr, between about 3 Torr and about 8 Torr, between about 8 Torr and about 12 Torr, and any other suitable ranges or values. In some embodiments, the plasma power level can be between about 500 W and about 3000 W. For example, the plasma power level can be between about 500 W and about 2000 W, between about 2000 W and about 3000 W, and any other suitable ranges or values. In some embodiments, the deposition process can use radical triggered chemical reaction with an ion filter. Using an ion filter in a plasma deposition process can improve the conformity of the deposited second seal material 432.

The dielectric constant of second seal material 432 can be the same or different from first seal material 412. For example, second seal material 432 can have a dielectric constant less than about 5. In some embodiments, second seal material 432 can have a dielectric constant between about 3.2 and about 5. In some embodiments, the leakage current in semiconductor structure 200 can be less than about $1E^{-8}$ A/cm$^2$ at 2 MV/cm.

Referring to operation 710 of FIG. 7, a treatment process is performed on the first and second seal materials of the seal layer, according to some embodiments. FIG. 4C is a cross-sectional view illustrating the semiconductor device after the treatment process is performed. A treatment process 435 can be performed on second seal material 432 to remove seams, such as seams 450. For example, an oxygen anneal process can be performed such that second seal material 432 physically expands and forms additional bonds at seam 450. During the oxygen anneal process, a portion of the Si—C—Si bonds in second seal material 432 can become Si—O—Si bonds. In some embodiments, the total carbon atomic ratio of second seal material 432 can decrease between about 5% and about 15%. In some embodiments, treatment process 435 can alter the silicon, oxygen, and carbon atomic contents of second seal material 432. For example, prior to treatment process 435, second seal material 432 can have an atomic content composition similar to that of first seal material 412. After treatment process 435, the atomic content of second seal material 432 can change. For example, treatment process 435 using an oxygen anneal process can increase the oxygen atomic content in second seal material 432. Therefore, second seal material 432 can have a higher oxygen atomic content than that of first seal material 412. In some embodiments, increasing the oxygen atomic content in second seal material 432 can lead to the physical expansion of second seal material 432 that results in additional bonds formed at seam 450. In some embodiments, the oxygen atomic content of second seal material 432 can be between about 40% and about 60%. For example, the oxygen atomic content can be between about 40% and about 45%, between about 45% and about 50%, between about 50% and about 60%, or any suitable ranges. In some embodiments, the carbon atomic content of second seal material 432 can be lower than that of first seal material 412. For example, the carbon atomic content of second seal material 432 can be between about 10% and about 25%. In some embodiments, the carbon atomic content can be between about 10% and about 15%, between about 15% and about 25%, or any suitable ranges. In some embodiments, the silicon atomic content of second material 432 formed using silicon oxycarbide can be between about 25% and about 40%. For example, the silicon atomic content can be between about 25% and about 33%, between about 33% and about 40%, or any suitable ranges. The oxygen treatment process can be performed for less than about 1 min. For example, the treatment process can be performed for between about 40 s and about 1 min. In some embodiments, the oxygen flow rate for treatment process 435 can be between about 1 sccm and about 10 sccm. For example, the oxygen flow rate can be between about 1 sccm and about 3 sccm, between about 3 sccm and about 5 sccm, between about 5 sccm and about 10 sccm, and any other suitable values. The oxygen anneal process can remove any seams such as seams 450 such that region 440 contains second seal material 432 without any seams.

Referring to operation 712 of FIG. 7, a planarization process is performed on the seamless seal layer, according to some embodiments. FIG. 5 is a cross-sectional view of a semiconductor device after the planarization process is performed. As shown in FIG. 5, seamless seal material 532 is formed on semiconductor structure 200, entrapping a pocket of air to form air gaps 542 between terminals of semiconductor structure 200 and a substrate such as fin region 221. Seamless seal material 532 can be formed between and in physical contact with spacer 210 and CESL 214. Seamless seal material 532 can also be in contact with other structures not illustrated in FIG. 5. A planarization process can be used to remove portions of first and second seal materials 412 and 432. The planarization process can continue until the top surfaces of gate electrode 216, gate dielectric layer 218, spacer 210, CESL 214, and S/D contacts 230 are exposed and are substantially level. After the planarization process, the remaining portions of first and second seal materials 412 and 432 can form seamless seal material 532. An air pocket entrapped by seamless seal material 532 can form air gaps 542 between terminals of semiconductor structure 200 such as gate structure 208 and S/D contacts 230. In some embodiments, air gaps 542 can include different types of air. For example, air gaps 542 can include oxygen, hydrogen, helium, argon, nitrogen, any other suitable types of air, and combinations thereof. A lower deposition rate of seamless seal material 532 can result in air gaps 542 having smaller volumes. For example, seamless seal material 532 can be formed by depositing first seal material 412 and second seal material 432, and a lower deposition rate of second seal material 432 can provide an air gap 542 having shorter height that results in a smaller air gap volume. As air gaps 542 can have a dielectric constant of about 1, the effective dielectric constant of spacer 210 and air gap 542 can be lower compared to a spacer structure consisting of spacers 210 and 214.

Referring to operation 714 of FIG. 7, dielectric layers and interconnect structures are formed, according to some embodiments. FIG. 6 is a cross-sectional view illustrating dielectric layers and interconnect structures formed on the semiconductor device.

A dielectric layer 620 can be formed on the top surfaces of gate electrode 216, gate dielectric layer 218, spacer 210, seamless seal material 532, CESL 214, S/D contacts 230, and other suitable structures. In some embodiments, dielectric layer 620 can be an etch stop layer. Dielectric layer 620 can be formed using a low-k dielectric material (e.g., dielectric layer having a dielectric constant lower than about 3.9), such as silicon oxide. An inter-layer dielectric (ILD) layer 650 can be formed on dielectric layer 620. ILD layer 650 can be formed of a low-k dielectric material. For example, ILD layer 650 can be formed using silicon oxide. In some embodiments, dielectric layer 620 and ILD layer 650 can be formed using CVD, ALD, PVD, flowable CVD (FCVD), sputtering, any suitable deposition process, and combinations thereof. Contacts can be formed in ILD 650 to establish electrical connection from S/D contacts 230 and gate electrode 216 to external circuitry, such as peripheral circuits formed above semiconductor structure 200. Gate vias 616 can be formed in ILD 650 and extend through dielectric layer 620 to be in physical contact with gate electrode 216. Similarly, S/D vias 630 can extend through ILD 650 and in physical contact with S/C contacts 230. Gate vias 616 and S/D vias 630 can be formed by a patterning and etching process. For example, openings can be formed in ILD 650 and through dielectric layer 620 to expose gate electrode 216 and S/D contact 216, respectively. A deposition process can be performed to deposit conductive material in the openings such that electrical connections can be made. Examples of the deposition process can be PVD, sputtering, electroplating, electroless plating, any suitable deposition process, and combinations thereof. A planarization process can be performed after the deposition process such that top surfaces of ILD 650, gate vias 616, and S/D vias 630 can be substantially coplanar (e.g., level). In some embodiments, gate vias 616 and S/D vias 630 can be formed using tungsten, aluminum, cobalt, silver, any suitable conductive material, and combinations thereof.

Various embodiments of the present disclosure provide semiconductor devices and methods of fabricating the same to provide simple and cost-effective structures and process for producing seamless seal layers in semiconductor devices. The seamless seal layers can be used to seal an opening and form air gaps between terminals of semiconductor devices to reduce effective dielectric constant that in turn can improve device performance. A bilayer seal material can be formed by depositing a first seal material, depositing a second seal material, and performing at least one treatment process on the deposited first and second materials.

In some embodiments, a method for forming a semiconductor device includes forming an opening between first and second sidewalls of respective first and second terminals. The first and second sidewalls oppose each other. The method further includes depositing a first dielectric material at a first deposition rate on top portions of the opening and depositing a second dielectric material at a second deposition rate on the first dielectric material and on the first and second sidewalls. The second dielectric material and the first and second sidewalls entrap a pocket of air. The method also includes performing a treatment process on the second dielectric material.

In some embodiments, a method for forming a semiconductor device includes forming a gate structure and a source/drain (S/D) contact on a substrate. The method also includes depositing a first dielectric material. A first portion of the first dielectric material is on a top portion of a sidewall of the gate structure. A second portion of the first dielectric material is on a top portion of a sidewall of the S/D contact. The method further includes depositing a second dielectric material. A first portion of the second dielectric material is on the first portion of the first dielectric material and on the sidewall of the gate structure. A second portion of the second dielectric material is on the second portion of the first dielectric material and on the sidewall of the S/D contact. Depositing the second dielectric material continues until the first and second portions of the second dielectric material are in contact with one another. The method further includes performing an oxygen treatment process on the deposited second dielectric material.

In some embodiments, a method for forming a semiconductor device includes forming an opening over a top surface of a substrate and between first and second terminals of the semiconductor device. The method further includes depositing a first dielectric material. A first portion of the first dielectric material is on a top portion of a sidewall of the first terminal. A second portion of the first dielectric material is on a top portion of a sidewall of the second terminal. The method also includes depositing a second dielectric material. A first portion of the second dielectric material is on the first portion of the first dielectric material. A second portion of the second dielectric material is on the second portion of the first dielectric material. A pocket of air is entrapped in the opening surrounded by the second dielectric material, the first and second terminals, and the substrate. The method also includes performing an oxygen treatment process on the deposited second dielectric material.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method for forming a semiconductor device, comprising:
    forming a first sidewall structure by forming an L-shaped spacer on a sidewall of a gate structure;
    forming a second sidewall structure by forming another spacer on a sidewall of a source/drain structure, wherein:
        the second sidewall structure is opposite to the first sidewall structure, and
        the first and second sidewall structures are formed of different layers and define boundaries of an opening;
    depositing a first dielectric material at a first deposition rate on top portions of the opening;
    depositing a second dielectric material at a second deposition rate on the first dielectric material and on the first and second sidewall structures, wherein the second dielectric material and the first and second sidewall structures entrap a pocket of air; and
    performing a treatment process on the second dielectric material.

2. The method of claim 1, wherein depositing the first dielectric material comprises flowing tetramethyldisiloxane (TMDSO) into a deposition chamber.

3. The method of claim 2, wherein depositing the first dielectric material further comprises flowing hydrogen and oxygen into the deposition chamber.

4. The method of claim 1, wherein depositing the second dielectric material comprises flowing tetramethyldisiloxane into a deposition chamber.

5. The method of claim 1, wherein depositing the second dielectric material comprises depositing first and second portions of the second dielectric material on the first and second sidewall structures, respectively.

6. The method of claim 5, wherein depositing the first and second portions of the second dielectric material comprises depositing the second dielectric material until the first and second portions of the second dielectric material are in contact with one another.

7. The method of claim 1, wherein the second deposition rate is less than that of the first deposition rate.

8. The method of claim 1, wherein the treatment process comprises an oxygen anneal process.

9. The method of claim 1, wherein performing the treatment process comprises expanding the second dielectric material during the treatment process.

10. A method for forming a semiconductor device, comprising:
    forming a gate structure and a source/drain (S/D) contact on a substrate;
    depositing a first dielectric material, wherein:
        a first portion of the first dielectric material is on a top portion of an L-shaped sidewall spacer of the gate structure; and
        a second portion of the first dielectric material is on a top portion of an etch stop layer of the S/D contact;
    depositing a second dielectric material, wherein:
        a first portion of the second dielectric material is on the first portion of the first dielectric material and on the L-shaped sidewall spacer of the gate structure; and
        a second portion of the second dielectric material is on the second portion of the first dielectric material and on the etch stop layer of the S/D contact, wherein depositing the second dielectric material continues until the first and second portions of the second dielectric material are in contact with one another; and
    performing an oxygen treatment process on the deposited second dielectric material.

11. The method of claim 10, wherein first dielectric material is deposited at a higher deposition rate than that of the second dielectric material.

12. The method of claim 10, further comprising performing a hydrogen treatment process on the deposited first dielectric material.

13. The method of claim 10, further comprising forming an air pocket surrounded by the second dielectric material, the gate structure, the S/D contact, and the substrate.

14. The method of claim 10, wherein depositing the second dielectric material comprises:
    forming a seam between the first and second portions of the second dielectric material when the first and second portions of the second dielectric material are in contact with one another; and
    removing the seam during the oxygen treatment process.

15. A method for forming a semiconductor device, comprising:
    forming a first sidewall structure by forming an L-shaped spacer on a sidewall of a first terminal of the semiconductor device;
    forming a second sidewall structure by forming another spacer on a sidewall of a second terminal of the semiconductor device, wherein the first and second sidewall structures define boundaries of an opening;
    depositing a first dielectric material, wherein:
        a first portion of the first dielectric material is on a top portion of the first sidewall structure of the first terminal; and
        a second portion of the first dielectric material is on a top portion of the second sidewall structure of the second terminal, wherein the first and second sidewall structures have different shapes;
depositing a second dielectric material, wherein:
a first portion of the second dielectric material is on the first portion of the first dielectric material; and
a second portion of the second dielectric material is on the second portion of the first dielectric material, wherein a pocket of air is entrapped in the opening surrounded by the second dielectric material, the first and second terminals, and the substrate; and
performing an oxygen treatment process on the deposited second dielectric material.

16. The method of claim 15, wherein the first dielectric material is deposited at a higher deposition rate than that of the second dielectric material.

17. The method of claim 15, further comprising performing a hydrogen treatment process on the deposited first dielectric material.

18. The method of claim 15, wherein depositing the second dielectric material comprises:
forming a seam between the first and second portions of the second dielectric material when the first and second portions of the second dielectric material are in contact with one another; and
removing the seam during the oxygen treatment process.

19. The method of claim 8, wherein the oxygen anneal process replaces Si—C—Si bonds with Si—O—Si bonds.

20. The method of claim 15, wherein the oxygen treatment process replaces Si—C—Si bonds with Si—O—Si bonds.

* * * * *